United States Patent
Plössl et al.

(10) Patent No.: US 6,770,542 B2
(45) Date of Patent: Aug. 3, 2004

(54) METHOD FOR FABRICATING SEMICONDUCTOR LAYERS

(75) Inventors: Andreas Plössl, Regensburg (DE); Berthold Hahn, Hemau (DE); Dominik Eisert, Regensburg (DE); Stephan Kaiser, Regensburg (DE)

(73) Assignee: OSRAM OPTO Semiconductors GmbH, Regensburg (DE)

( * ) Notice: Subject to any disclaimer, the term of this patent is extended or adjusted under 35 U.S.C. 154(b) by 2 days.

(21) Appl. No.: 10/324,428

(22) Filed: Dec. 20, 2002

(65) Prior Publication Data

US 2003/0119217 A1 Jun. 26, 2003

(30) Foreign Application Priority Data

Dec. 20, 2001 (DE) .......................................... 101 63 081
Nov. 21, 2002 (DE) .......................................... 102 54 457

(51) Int. Cl.$^7$ .......................... H01L 21/30; H01L 21/46
(52) U.S. Cl. ........................ 438/458; 438/455; 438/406
(58) Field of Search ................................ 438/455, 458, 438/406

(56) References Cited

U.S. PATENT DOCUMENTS

| | | | |
|---|---|---|---|
| 6,071,795 A | 6/2000 | Cheung et al. | |
| 6,210,479 B1 | 4/2001 | Bojarczuk et al. | |
| 6,323,108 B1 | * 11/2001 | Kub et al. | ................. 438/458 |
| 2001/0042866 A1 | 11/2001 | Coman et al. | |

FOREIGN PATENT DOCUMENTS

| | | |
|---|---|---|
| DE | 37 40 773 A1 | 6/1989 |
| DE | 100 00 088 A1 | 8/2000 |
| DE | 100 17 336 A1 | 10/2001 |
| FR | 2 775 121 A1 | 8/1999 |
| WO | 99/41776 | 8/1999 |
| WO | 01/70005 A2 | 9/2001 |

OTHER PUBLICATIONS

Li Yingxue et al.: "SOI Wafer Achieved By Smart–Cut Process", *Proceedings of the 5th International Conference on Solid–State and Integrated Circuit Technology*, Beijing, China, Oct. 21–23, 1998, pp. 761–764.
B. Aspar et al.: "Smart–Cut® process using metallic bonding: Application to transfer of Si, GaAs, InP thin films", *Electronic Letters*, vol. 35, No. 12, Jun. 10, 1999, pp. 1024–1025.

* cited by examiner

*Primary Examiner*—Long Pham
(74) *Attorney, Agent, or Firm*—Laurence A. Greenberg; Werner H. Stemer; Gregory L. Mayback

(57) ABSTRACT

A method is provided for fabricating a useful layer containing at least one semiconductor layer, in which the useful layer is separated from a carrier. In this case, the useful layer is applied to the carrier and an auxiliary carrier is applied to that side of the useful layer that is remote from the carrier by a connecting layer at a joining temperature. Afterward, the carrier is stripped away at a temperature that is greater than or equal to the joining temperature and is less than the melting point of the connecting layer. At least a part of the useful layer together with the auxiliary carrier is removed from the carrier.

16 Claims, 2 Drawing Sheets

METHOD FOR FABRICATING SEMICONDUCTOR LAYERS

BACKGROUND OF THE INVENTION

Field of the Invention

The invention relates to a method for fabricating semiconductor layers.

During the fabrication of thin-film semiconductor components such as thin-film LEDs, for example, it is customary for one or more semiconductor layers to be applied successively to a suitable carrier. The carrier is generally a substrate or a quasi-substrate on which the individual semiconductor layers are successively grown epitaxially. The semiconductor layers, which together constitute the so-called "useful layer", are then stripped away from the carrier. To that end, a desired separating plane along which the separation is to be effected is provided in the carrier or else in the useful layer.

Before the stripping-away process, the useful layer must be connected to an auxiliary carrier (also referred to as a "support wafer") on account of the small thickness of the layer and the accompanying mechanical instability. Since the surface of the useful layer is generally metallized in order to form electrical terminals, the auxiliary carrier is usually bonded eutectically onto the metallized surface of the useful layer.

However, a composite of a carrier, an useful layer and an auxiliary carrier fabricated in this way tends to split in the metallization plane, i.e. the plane in which the bonding connection between the auxiliary carrier and the useful layer is located, instead of in the desired separating plane. In this case, there is the risk of the useful layer being damaged or partly remaining on the carrier. The useful layer cannot be transferred in this case. On account of the major technological difficulties in the separation of the carrier and the useful layer when using an auxiliary carrier with a metal compound, hitherto the auxiliary carrier has been bonded directly onto the useful layer or adhesively bonded onto glass ("silicon on glass", SOG), so that a metal layer has not been formed between the auxiliary carrier and the useful layer.

SUMMARY OF THE INVENTION

It is accordingly an object of the invention to provide a method for fabricating semiconductor layers that overcomes the above-mentioned disadvantages of the prior art methods of this general type, in which the semiconductor layer is stripped away from a carrier as far as possible completely along a predetermined desired separating plane. In particular, the intention is to be able to carry out the method with an auxiliary carrier that has a metallic layer or is connected to the semiconductor layer by a metallic layer.

With the foregoing and other objects in view there is provided, in accordance with the invention, a fabrication method. The method includes providing a carrier, applying a useful layer containing at least one semiconductor layer to the carrier, applying an auxiliary carrier to that side of the useful layer remote from the carrier with a connecting layer disposed between the auxiliary carrier and the useful layer at a joining temperature, and mechanically stripping away the carrier at a temperature greater than or equal to the joining temperature and is less than a melting point of the connecting layer. At least a part of the useful layer together with the auxiliary carrier is stripped away from the carrier.

In the method for fabricating the useful layer containing at least one semiconductor layer, in a first step, the useful layer is applied to the carrier and, in a further step, at a joining temperature, the auxiliary carrier is applied to that side of the useful layer which is remote from the carrier by use of the connecting layer, which preferably has a metallic material. Afterward, the carrier is stripped away at a temperature that is greater than or equal to the joining temperature and is less than the melting point of the connecting layer. The useful layer is separated at least partly, preferably completely, together with the auxiliary carrier from the carrier. The stripping away is preferably effected mechanically.

In this case, the invention is based on the insight that a mechanical strain resulting from the connection of the auxiliary carrier to the useful layer must be reduced to the greatest possible extent in order not to impair the separation process.

Mechanical strains can arise in particular as a result of the temperature change required for connecting the auxiliary carrier to the useful layer. Thus, during the eutectic bonding of the auxiliary carrier, the system is heated to a temperature at which the bonding reaction occurs. The overall system is stress-free at this temperature. The auxiliary carrier is fixed on the useful layer by the formation of the bonding connection. In conventional methods, the composite containing the carrier, the useful layer and the auxiliary carrier is subsequently cooled for further processing.

Since the thermal expansion coefficients of the metals that are customarily used for the bonding connection, such as Au, Pt, Pd, Al, for example, are significantly larger than those of most semiconductors, mechanical stresses arise during cooling, so that the connecting layer is tensile-strained at room temperature.

During the layer transfer that takes place at room temperature in conventional methods, a separating tear is initiated between the carrier and the useful layer. On account of the mechanical strain or the strain field in the system, the separating tear is conducted into the metallization layer and leads to incorrect separation, i.e. to separation along the metal layer and thus to the undesirable stripping away of the auxiliary carrier.

It has been shown in the context of the invention that such incorrect separation can be avoided by a separation at a temperature that approximately corresponds to the joining temperature or is greater than the joining temperature. During mechanical separation at the joining temperature, the separating tear runs between the carrier and the useful layer with the auxiliary carrier in the desired tear plane, i.e. the useful layer is separated together with the auxiliary carrier as desired from the original carrier.

Surprisingly, then, an increase in temperature leads to a better connection between the auxiliary carrier and the useful layer, even though it would be expected in principle that, by way of example, a metal compound becomes softer and thus more unstable in the event of an increase in temperature.

What is essential to the invention is that the composite of the useful layer and the carrier is at least approximately at the joining temperature during the separation process or the composite is heated at least to the level of the joining temperature for the separation process. By virtue of the increase in temperature, the strain gradient in the region of the desired separating plane or the—for example metallic—connecting layer between the useful layer and the auxiliary carrier is compensated for or at least reduced to an extent such that a separating tear, once initiated, propagates in the desired separating plane. To that end, a connection between the useful layer and the auxiliary carrier is used which has a sufficient mechanical stability at the joining temperature and, in particular, does not melt.

A material system whose melting point is sufficiently in excess of the joining temperature after the connection process is preferably used for the connection. Suitable material systems for the connecting layer for the connection of the auxiliary carrier and the useful layer are PdIn, AuSi, PdSi or PtSi, for example. The melting points of such compounds are significantly greater than the respective joining temperatures. Thus, in the case of a PdIn compound, for example, the joining temperature is about 200° C., whereas the melting point is 664° C. The corresponding temperatures of the other material systems mentioned lie in a similar range.

Materials for the connection in the case of which the difference between the melting point and the joining temperature is greater than or equal to 40% of the joining temperature, in particular greater than or equal to 100% of the joining temperature, are generally preferred in the case of the invention.

In particular, a suitable selection of the joining method and the metallization is essential to the invention, so that mechanically stable connections are present at the joining temperature or similar temperatures. In the case of the invention, the auxiliary carrier and the useful layer are preferably joined together by diffusion bonding or isothermal solidification.

The invention advantageously makes it possible to introduce metallic intermediate layers between the useful layer and the auxiliary carrier that are suitable for a mechanical layer transfer (wafer transfer). As a result, the useful layers which are metallized on the top side, and described in the introduction, can also be processed. The lift-off methods or wedge separation methods known from SOG technology can thus be transferred to material systems in which direct bonding has not been possible heretofore.

In particular, the invention is therefore suitable for semiconductor materials based on nitride compound semiconductors. Nitride compound semiconductors are to be understood as nitride compounds of elements of the third and/or fifth main group of the periodic table, in particular GaN, AlGaN, InGaN, AlInGaN, AlN or InN. Such semiconductor layers are preferably grown (i.e. epitaxially) on carriers containing SiC (silicon carbide), for example in the form of SiC substrates or SiC/Si quasi-substrates.

A quasi-substrate is a composite containing a substrate body, a growth layer and, where appropriate, an intermediate layer disposed in between. Generally, the growth layer is significantly thinner than the substrate body and optimized with regard to an epitaxial deposition of the useful layer. The separation is preferably effected along the intermediate layer. In this case, it is advantageous to modify the bond strength of the intermediate layer such that separation along the intermediate layer is facilitated. By way of example, a silicon oxide intermediate layer is suitable for quasi-substrates with an SiC substrate body and an SiC growth layer.

An Si substrate, for example, can be used as auxiliary carrier.

In addition, the invention enables the (mechanical) layer transfer in the case of heterogeneous useful layer/auxiliary carrier systems, without adhesive bonding being necessary.

Other features which are considered as characteristic for the invention are set forth in the appended claims.

Although the invention is illustrated and described herein as embodied in a method for fabricating semiconductor layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
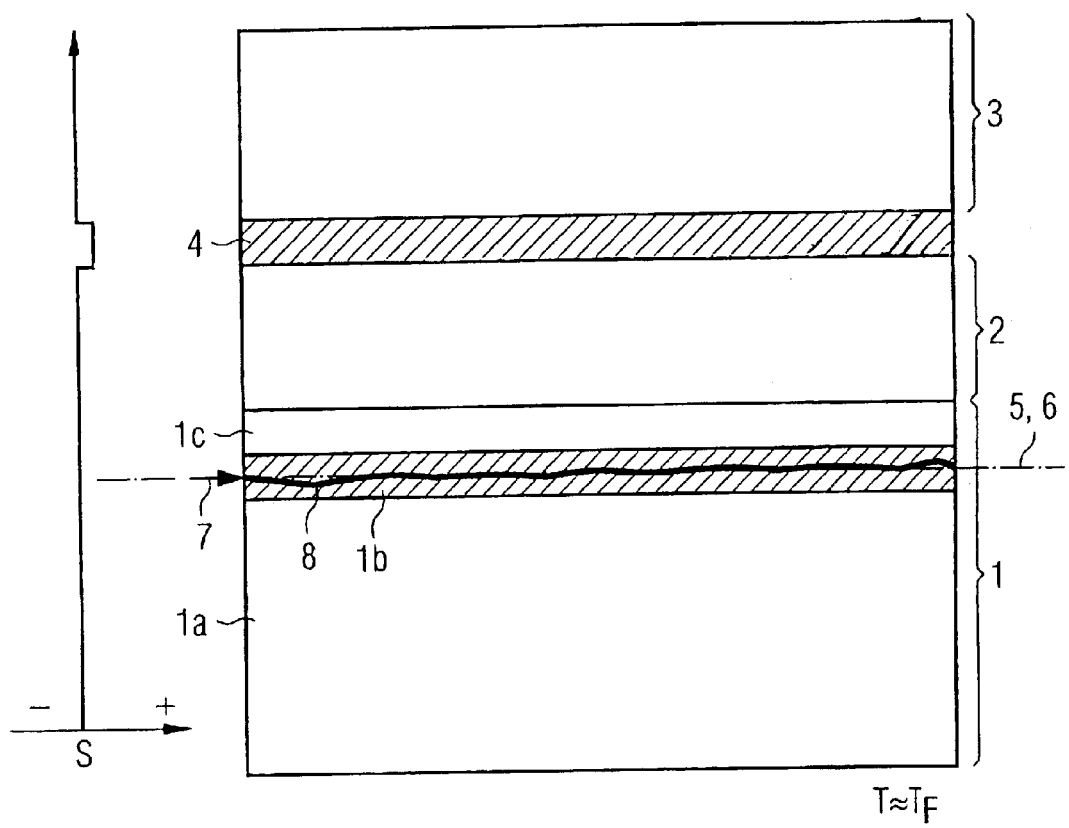
FIG. 1 is a diagrammatic, sectional view of a composite of a carrier, a useful layer and an auxiliary carrier for a method according to the invention and also a resultant profile of a separating tear.

Referring now to the figures of the drawing in detail and first, particularly, to FIG. 1 thereof, there is shown a composite containing a carrier 1, a useful layer 2 and an auxiliary carrier 3. The carrier 1 is embodied as a quasi-substrate and contains a substrate body 1a, an intermediate layer 1b and a growth layer 1c. The substrate body 1a is preferably embodied as a SiC wafer, the intermediate layer 1b as a SiO layer and the growth layer as a SiC layer. As an alternative, a quasi-substrate with a Si wafer as the substrate body 1a, an SiO intermediate layer 1b and a Si or SiC growth layer 1c can also be used as the carrier 1.

The useful layer 2, preferably based on a nitride compound semiconductor, is grown epitaxially on the growth layer 1c. In particular, the useful layer 2 may contain a plurality of semiconductor layers based on nitride compound semiconductors such as GaN, AlGaN, InGaN, AlInGaN, AlN. By way of example, as the useful layer 2, a stack of semiconductor layers made of GaN, AlGaN, InGaN, AlInGaN, AlN and/or InN may be deposited epitaxially on the carrier 1 or the growth layer 1c.

The auxiliary carrier 3 is applied to the useful layer 2, a metallic connection or connecting layer 4 being formed between the auxiliary carrier 3 and the useful layer 2. A silicon substrate, for example, may be used as the auxiliary carrier 3. A molybdenum auxiliary carrier would also be suitable.

In order to form the connection, the useful layer 2 and the auxiliary carrier 3 are joined together at a joining temperature, which may be about 200° C., for example, and the connection is formed by diffusion bonding or isothermal solidification. What is essential in this case is that the melting point of the connecting layer 4 is greater than the joining temperature. In this case, PdIn, for example, is suitable as material for the connecting layer 4. Furthermore, AuSi, PdSi or PtSi can also be used as material for the connecting layer 4.

Afterward, in the case of the invention, the useful layer 2 and the auxiliary carrier 3 and also the growth layer 1c are separated mechanically from the substrate body 1a at the joining temperature. In this case, a separating tear 7 is initiated in the intermediate layer 1b, and propagates along the intermediate layer 1b until the substrate body 1a is completely separated.

Figure 2:
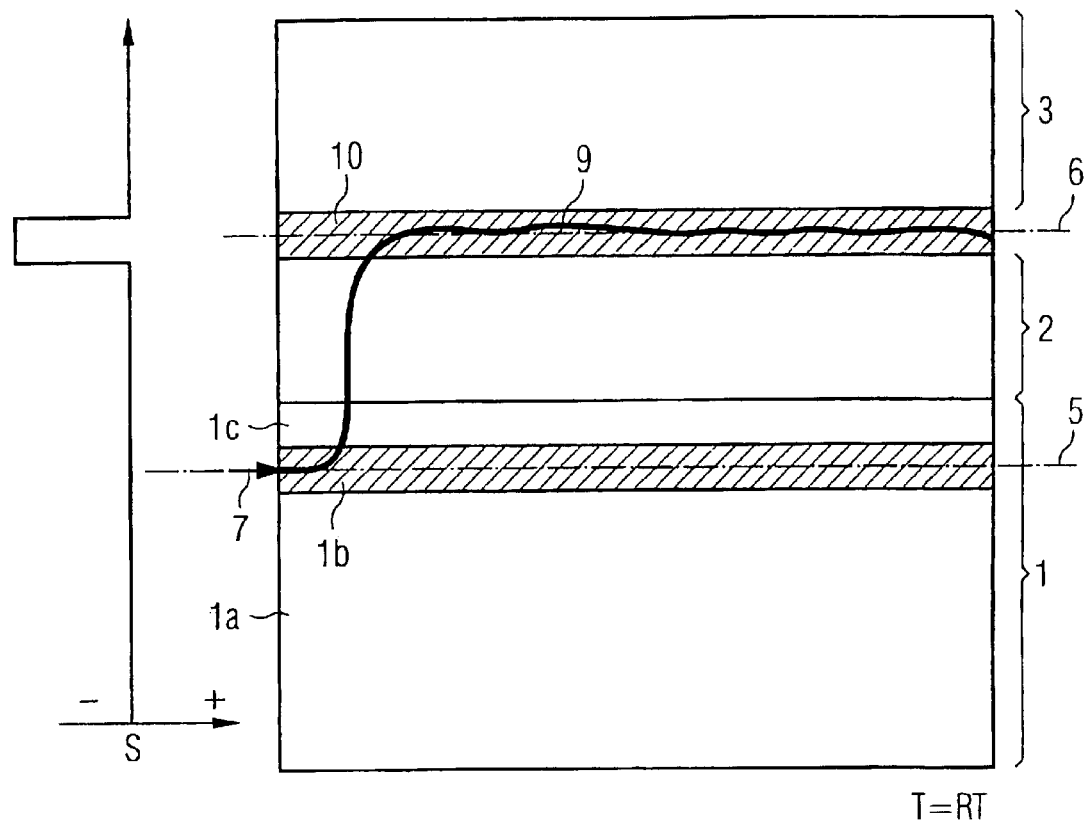
FIG. 2 is a diagrammatic, sectional view of a composite of the carrier, the useful layer and the auxiliary carrier and a profile of the separating tear in the case of a method according to the prior art.

For comparison, a conventional composite of the carrier 1, the useful layer 2 and the auxiliary carrier 3 according to the prior art is shown in FIG. 2. The separation takes place at room temperature (RT). On account of the significantly lower temperature during separation in comparison with the joining temperature, metallic materials, such as AuSn, for example, are used in conventional methods for a connecting layer 10 between the useful layer 2 and the auxiliary carrier 3. The risk of a connection formed by the connecting layer 10 being weakened by melting is negligible here since the connection is not heated during the separation.

The connecting layer 10 is severely tensile-strained on account of the cooling from the joining temperature to room temperature (RT) and a significantly larger thermal expansion coefficient of the connecting layer 10 relative to the adjoining layers 2 and 3. A mechanical stress S is illustrated diagrammatically in FIG. 2 on the left beside the composite. A positive stress corresponds to a compressive stress and a negative stress corresponds to a tensile stress. As shown by the stress profile along the composite, a large tensile stress prevails in a region of the connecting layer 10.

During the separation, a separating tear 9 propagates from the point of the tear initiation 7 first in the intermediate layer 1b, then in the direction of the connecting layer 10 and then along the connecting layer 10, so that for the most part only the auxiliary carrier 3 is separated. Thus, whereas the envisaged desired separating plane 5 lies within the intermediate layer 1b, the actual separating plane 6 along which the composite is separated runs in the connecting layer 10. Apart from the slight portion in the vicinity of the tear initiation 7, the desired stripping away of the useful layer 2 is not achieved. Rather, essentially only a faulty stripping away of the auxiliary carrier 3 is effected, the useful layer 2 being partly destroyed.

In the case of the invention, in contrast, the magnitude of the mechanical strain in the connection 4 is significantly smaller, as shown by the profile of the stress S along the composite that is illustrated correspondingly in FIG. 1. Propagation of a separating tear 8 in the direction of the connecting layer 4 or along the connecting layer 4 is thus avoided. Moreover, a small positive stress S, that is to say a slight compressive stress, prevails in the connecting layer 4, which is advantageous for the separation method.

In the case of the invention, the separating tear 8 propagates along the desired separating plane 5, for example in the intermediate layer 1b, thereby enabling largely complete stripping away of the useful layer 2. The actual separating plane 6 and the desired separating plane 5 coincide in this case.

The explanation of the invention using the exemplary embodiments is not to be understood as a restriction.

We claim:

1. A fabrication method, which comprises the steps of:
    providing a carrier;
    applying a useful layer containing at least one semiconductor layer to the carrier;
    applying an auxiliary carrier to that side of the useful layer remote from the carrier with a connecting layer disposed between the auxiliary carrier and the useful layer at a joining temperature; and
    mechanically stripping away the carrier at a temperature greater than or equal to the joining temperature and is less than a melting point of the connecting layer, at least a part of the useful layer together with the auxiliary carrier being stripped away from the carrier.

2. The method according to claim 1, which comprises forming one of the useful layer and the semiconductor layer from a nitride compound semiconductor.

3. The method according to claim 2, which comprises using a nitride compound of elements of the third and/or fifth main group as the nitride compound semiconductor.

4. The method according to claim 1, which comprises forming the carrier from SiC.

5. The method according to claim 1, which comprises forming the carrier as a quasi-substrate having a substrate body, an intermediate layer and a growth layer, the useful layer being applied to the growth layer.

6. The method according to claim 5, which comprises forming at least one of the growth layer and the substrate body from a material selected from the group consisting of silicon, silicon oxide and silicon carbide.

7. The method according to claim 5, which comprises forming the intermediate layer from silicon oxide.

8. The method according to claim 5, which comprises during the mechanically stripping away step, separating the useful layer and the carrier along the intermediate layer.

9. The method according to claim 1, which comprises selecting the connecting layer disposed between the useful layer and the auxiliary carrier to have a melting point greater than the joining temperature.

10. The method according to claim 9, which comprises forming the connecting layer from a material selected from the group consisting of PdIn, AuSi, PdSi and PtSi.

11. The method according to claim 1, which comprises forming the auxiliary carrier from a material selected from the group consisting of silicon and molybdenum.

12. The method according to claim 1, which comprises applying the auxiliary carrier to the useful layer using a diffusion bonding method.

13. The method according to claim 1, which comprises applying the auxiliary carrier to the useful layer using an isothermal solidification method.

14. The method according to claim 1, which comprises growing the useful layer epitaxially on the carrier.

15. The method according to claim 1, which comprises forming the connecting layer from a metallic material.

16. The method according to claim 3, which comprises selecting the nitride compound semiconductor from the group consisting of GaN, AlGaN, InGaN, AlInGaN, AlN and InN.

* * * * *